United States Patent [19]

Stumme

[11] Patent Number: 5,272,438

[45] Date of Patent: Dec. 21, 1993

[54] FIELD TEST UNIT FOR CIRCUIT BREAKER

[75] Inventor: Gary M. Stumme, Cedar Rapids, Iowa

[73] Assignee: Square D Company, Palatine, Ill.

[21] Appl. No.: 320,356

[22] Filed: Mar. 8, 1989

[51] Int. Cl.[5] ............................................. G01R 31/02
[52] U.S. Cl. ..................................... 324/424; 340/638
[58] Field of Search ................. 324/424, 509; 340/638

[56] References Cited

U.S. PATENT DOCUMENTS

| | | | |
|---|---|---|---|
| 4,004,201 | 1/1977 | DePuy | 324/424 |
| 4,105,965 | 8/1978 | Russell | 324/424 |
| 4,611,174 | 9/1986 | Arnoux et al. | 324/424 |
| 4,814,712 | 3/1989 | Burton et al. | 324/424 |
| 4,870,532 | 9/1989 | Beatty, Jr. et al. | 324/424 |
| 4,983,955 | 1/1991 | Ham, Jr. et al. | 324/133 |

Primary Examiner—Kenneth A. Wieder
Assistant Examiner—Maura K. Regan
Attorney, Agent, or Firm—Larry I. Golden; Kareem M. Irfan

[57] ABSTRACT

A portable field tester for a circuit breaker having an electronic trip unit includes a ribbon cable having a connector plug for making connection to a restraint plug socket of the trip unit. The tester has a parallel connector in which the breaker rating plug may be inserted. A battery source is included and a battery fail LED is illuminated if the source voltage falls below a certain level. A voltage regulator and a plurality of voltage dividers develop reference test voltages for application to the breaker trip unit via the connectors and cable. Switches selectively disable a ground fault test circuit in the breaker during primary injection testing. A pair of resistors are connected via the cable and connectors for rapidly discharging the breaker memory circuits after each test.

10 Claims, 3 Drawing Sheets

FIELD TEST UNIT FOR CIRCUIT BREAKER

BACKGROUND OF THE INVENTION AND PRIOR ART

This invention relates in general to industrial type circuit breaker testers and particularly to portable testers for on site testing of circuit breakers. In addition to being factory tested, power circuit breakers are generally operationally tested in the field under low voltage conditions to verify their capability for tripping rated fault currents in a prescribed time. Two types of testing, generally categorized as unpowered or "dry" testing and primary injecting testing, are used. These tests require technicians to bring expensive and cumbersome test equipment to a construction site, which equipment generally is powered from an AC line that may not be conveniently available at the site. Regulations that govern installation of breakers in distribution systems also require system testing to verify that the wiring is correct and that the circuit breakers operate properly before power is applied.

The dry test and the low voltage high current test (primary injection) provide a relatively simple test sequence for determining the operability of the electronic tripping circuitry of the breaker. This circuitry is contained in a structure referred to as a trip unit. Dry testing rapidly verifies the basic electronic functioning of the trip unit and subjects the breaker to simulated phase (∅) overload and simulated ground fault (GF) tests to verify operation of any time delay circuits. Since the breaker has been tested at the factory, on site dry testing assures that the breaker electronics were not damaged during shipment or handling. Primary injection testing verifies that the wiring outside of the circuit breaker is proper as well as assuring the basic functioning of the circuit breaker before full voltage is applied to the distribution system.

In primary injection testing, a low voltage source is used to supply very high current through one (or more) poles of a breaker. Each pole is subjected to individual testing and if the breaker is equipped with integral ground fault protection circuitry, that must be defeated since the ground fault sensing mechanism will trip the breaker before the rated test current is attained. Conventionally, the ground fault sensing system is offset by attaching heavy cables to pass an equal and oppositely directed current through another pole of the breaker. This prevents detection of an unbalanced current condition by the ground fault system.

Three phase, four wire systems requiring a neutral current transformer (known as fourth CT) may require an additional power source with its attendant additional wiring. Further, the electronic trip units of the breakers may include memory circuits for integrating previous phase and ground fault currents experienced in the system. The memory circuits have time constants which may require as much as five minutes for phase tests and 30 seconds for GF tests to discharge or clear. This significantly slows down testing since the memories must be cleared after each test.

The tester of the invention is described in conjunction with Square D Company type ME/NE/PE Micrologic (Trademark) circuit breakers. These circuit breakers have a removable rating plug that is interconnected with the circuit breaker trip unit by means of a 20-pin connector. The current rating of the breaker may be readily changed by using a different rating plug, which consists of a plurality of resistive elements that are connected by the connector terminals to the various sensing circuits in the trip unit.

Overload tripping is a relatively long time test with the test current being slowly brought up to determine a so-called pickup level. At the pickup level, the delay time is measured. The delay time is how long it takes the breaker to trip after the pickup level with a continuing current overload. A five minute waiting period is required to allow the overload delay memory to clear (reset) before testing the next pole of the breaker. If the trip unit includes an integral ground fault circuit, the test current must be routed to pass in the opposite direction through another pole. There are also short time trip tests which utilize a memory for recording the effects of successive overcurrents. This memory must be discharged for 30 seconds before a subsequent test is undertaken. As mentioned, ground fault testing of three phase, four wire systems requires a separate power supply. The field test unit of the invention eliminates the need for a second power supply for powering the trip unit in the breaker.

The Square D Company Micrologic (Trademark) line of circuit breakers also include "restraint" features which permit downstream circuit breakers to restrain or hold off tripping of upstream circuit breakers. The feature results in a downstream breaker (i.e. one closer to the fault) tripping first and thereby avoiding a complete system shutdown when a fault occurs. The restraint feature must be defeated during verification testing of the short time tripping and ground fault tripping functions. In accordance with the invention, the Restraint In and Restraint Out terminals on the connector of the trip unit are shorted together, thus disabling the restraint operation.

The field test unit constructed in accordance with the invention can be used to: directly verify phase and ground fault tripping; power the trip unit and eliminate the need for an extra power supply during primary injection testing and fourth CT ground fault testing; and disable the ground fault function during phase testing.

OBJECTS OF THE INVENTION

A principal object of the invention is to provide a novel field tester for electronically tripped circuit breakers.

Another object of the invention is to provide a field tester that greatly simplifies electronically tripped circuit breaker testing.

BRIEF DESCRIPTION OF THE DRAWINGS

These and other objects and advantages of the invention will be apparent upon reading the following description in conjunction with the drawings in which.

DESCRIPTION OF THE PREFERRED EMBODIMENT

Figure 1:
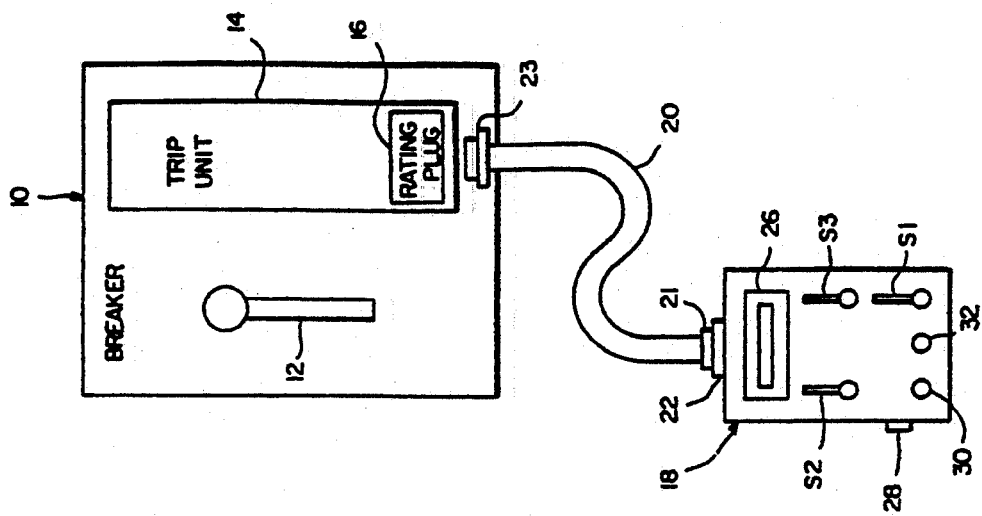
FIG. 1 is a pictorial view of a circuit breaker having an electronic trip unit with the field tester of the invention in position for use therewith.

In FIG. 1, a Square D Company ME/NE/PE Micrologic TM electronically trippable circuit breaker is shown in block form. A rotatable handle 12 is mounted on the breaker for manually opening and closing the breaker. An electronic trip unit 14, including a removable rating plug 16, is included in the breaker 10. Circuit breaker 10 is well known in the art, as is electronic trip unit 14 and rating plug 16. Rating plug 16 terminates in a 20-pin ribbon type plug (not shown) that plugs into a matching 20-pin connector socket (not shown) installed in trip unit 14. The 20-pin connector plug and socket each has two parallel rows of terminals identified in the sequence A, 1, B, 2, C, 3 ... K, 10. Details of the electronic trip unit circuitry are omitted for simplicity.

A portable field tester 18, preferably capable of being held in a technician's hand, includes a 20-pin connector plug 23 that enables field tester 18 to be connected to the connector socket of trip unit 14, from which the rating plug 16 has been removed. This is accomplished with a ribbon type cable 20 having mating 20-pin connector plugs 21 and 23 at each end with connector plug 23 being connectable into trip unit 14 (where rating plug 16 was) and connector plug 21 being connectable into connector socket 22 on field tester 18. Field tester 18 also includes another 20-pin connector socket 26 in parallel with connector socket 22, into which rating plug 16 may be inserted for certain tests. Three toggle type switches, S1, S2 and S3 are mounted on the face of field tester 18 as are two light emitting diode (LED) type indicating lamps 30 and 32. A power input jack 28 is mounted in the side of field tester 18 for enabling an alternate power source to be used to energize the field tester 18.

Figure 2:
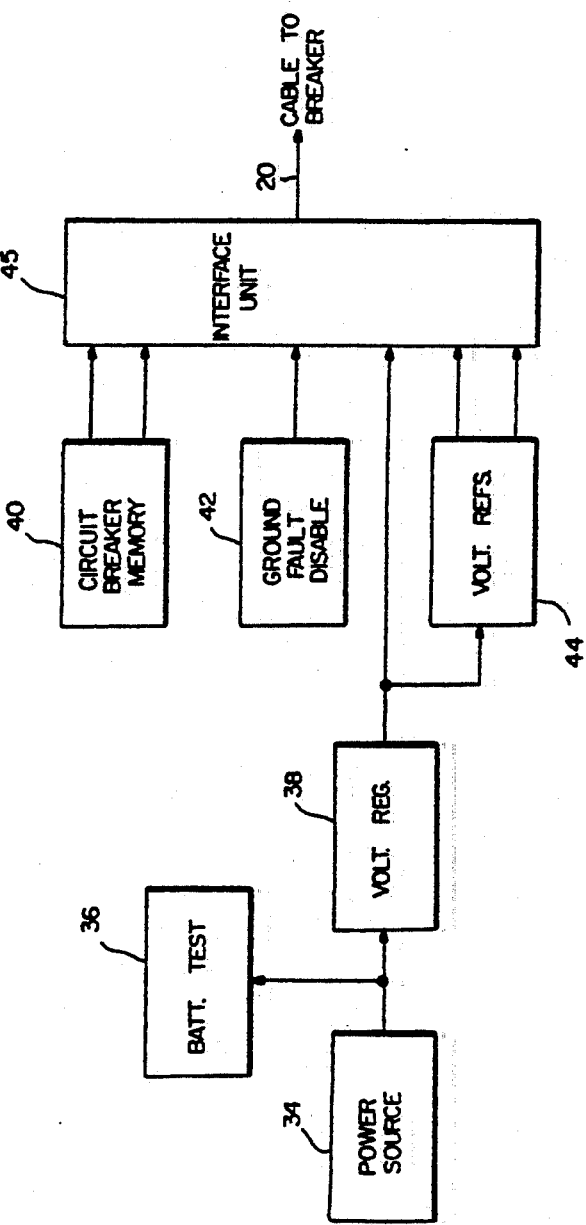
FIG. 2 is a simplified functional block diagram of the field tester.

As shown in FIG. 2, a power source block 34 is coupled to a voltage regulator block 38 and to a battery test block 36. The output of the voltage regulator block 38 is supplied to a Voltage Reference block 14 for developing a pair of reference voltages that are connected to an interface block 45 that includes connector sockets 22 and 26. The output of voltage regulator block 38 is also applied directly to interface block 45. A circuit breaker memory block 40 and a ground fault disable block 42 are also connected to the interface block 45.

The power source block 34 includes a battery source, but may also include an external AC operated DC source. As is conventional, battery power is disconnected when an AC powered source is plugged in. Toggle switch S1 has an on, an off, and a momentary on position. The battery test block contains the test on and battery low indicators which correspond to LED's 30 and 32 in FIG. 1. The voltage reference block 44 develops test reference voltages and applies them to the appropriate terminals of the connectors in interface block 45 in accordance with the test selected. The ground fault disable block 42 disables the ground fault function of the circuit breaker under test and the circuit breaker memory block functions to discharge the circuit breaker memories when power is removed from the circuit breaker. The interface block 45 includes the rating plug connector socket 26 and the interface connector 22.

Figure 3:
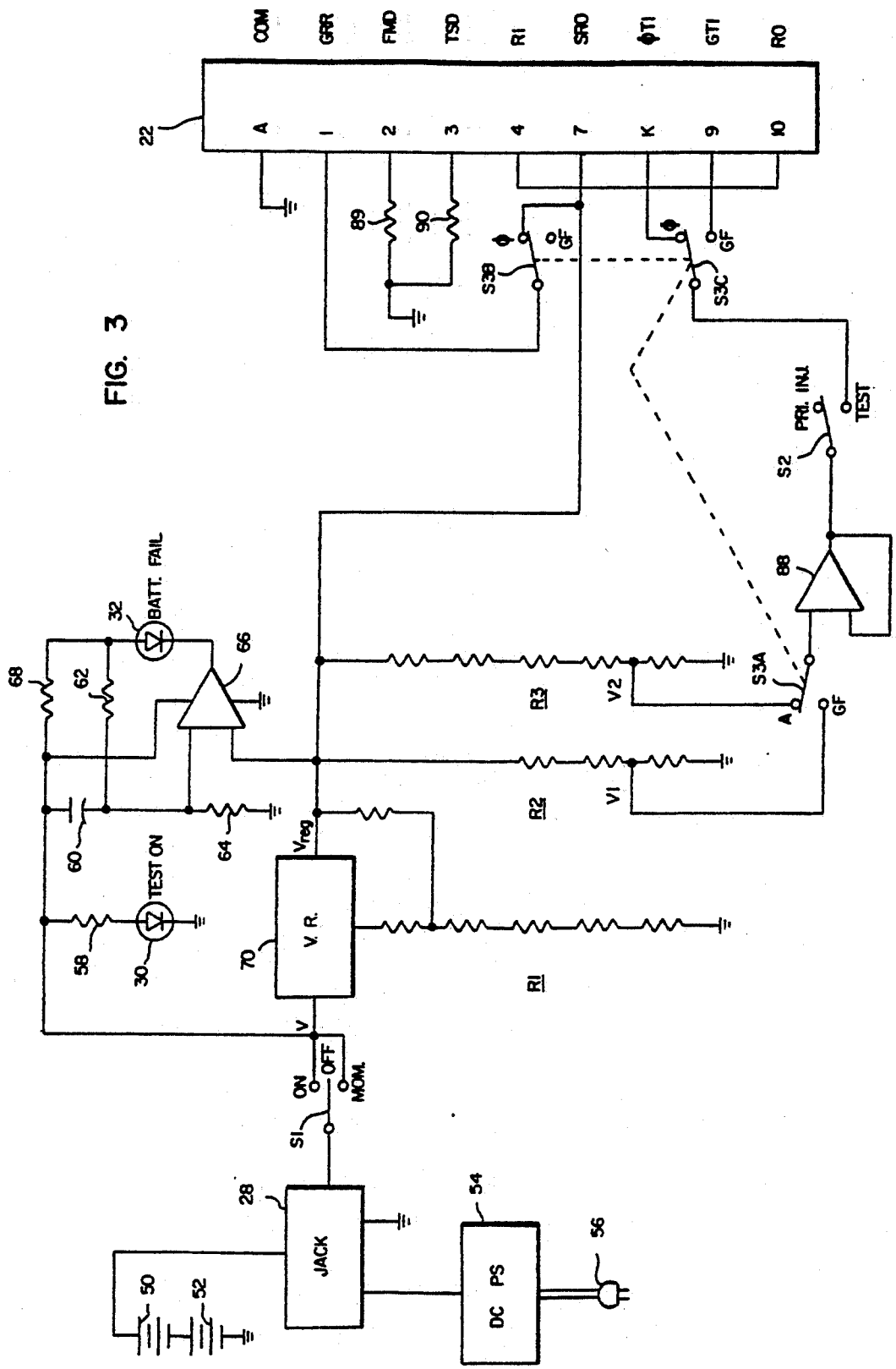
FIGS. 3 and 4 together are a schematic diagram and a block diagram of the field tester of the invention and the trip unit of a breaker.

Referring to FIG. 3, a block 28 labelled jack is coupled to a pair of serially connected batteries 50 and 52 and to a DC power supply 54 that is connectable to a source of 120 volt AC power through an AC plug 56. Jack 28 may include, for example, a jack of well known construction that functions to disconnect the batteries 50 and 52 when the power supply 54 is plugged in. The DC input voltage is supplied to switch 91, which has three positions: off, on and momentary on. The on and momentary on position terminals are connected together and to a resistor 58 connected in series with LED 30. A resistor 68, connected in series with LED 32, couples the output of an operational amplifier 66 to +V voltage supplied from the on terminal of S1. A capacitor 60 is connected from +V to the junction of a pair of resistors 62 and 64 and to the input of operational amplifier 66. Resistor 64 is grounded and resistor 62 is connected to the junction of resistor 68 and LED 32.

The +V voltage is also supplied to a voltage regulator 70 which supplies a resistor pack R1 comprising a series string of six resistors. An output voltage Vreg is developed by voltage regulator 70. Vreg is connected to the other input of operational amplifier 66 and to a pair of voltage dividers comprising resistor packs R2 and R3. R2 consists of three resistors and R3 consists of a series of five resistors. The resistor packs are used because of their excellent repeatability within one semiconductor chip. With them the voltages V1 and V2 may be very closely controlled. Vreg is also connected to a terminal 7, labelled SRO, on connector socket 22 for applying DC power directly to the trip unit. The trip unit power supply (not shown) has a shunt current regulator and the SRO connection bypasses them for imposing minimum loading on the field tester power supply. V1 and V2 reference potentials from the resistor packs R2 and R3 are supplied to respective terminals, labelled $\emptyset$ for phase and GF for ground fault, of switch S3A. Switch S3A is mechanically interconnected with switches S3B and S3C for simultaneous operation. Switch S3A is connected to one input of an operational amplifier 88, the other input of which is connected to its output. The output of amplifier 88 is also connected to switch S2 which is movable between two terminals labelled PRI INJ (primary injection) and TEST. The TEST terminal is connected to the pole or blade of switch S3C which is movable between a pair of terminals, labelled GF and $\emptyset$. Switch S3B is coupled to terminal 1 of connector socket 26. Terminal A, labelled COM, is grounded and terminals 2 and 3 are connected to ground through resistors 89 and 90, respectively. Terminal 1 is labelled GRR, terminal 2, labelled FMD, represents the five minute memory connection, terminal 3, labelled TSD, represents the 30 second memory connection, terminals 4 (RI) and 10 (RO) are connected together and are connected to the Restraint In and Restraint Out terminals on the breaker trip unit. The $\emptyset$ terminal of switch S3B is connected to pin 7 and the $\emptyset$ terminal of switch 93C is connected to terminal K, labelled $\emptyset$TI, of connector socket 26. The GF terminal of switch S3C is connected to terminal 9, labelled GTI.

Figure 4:
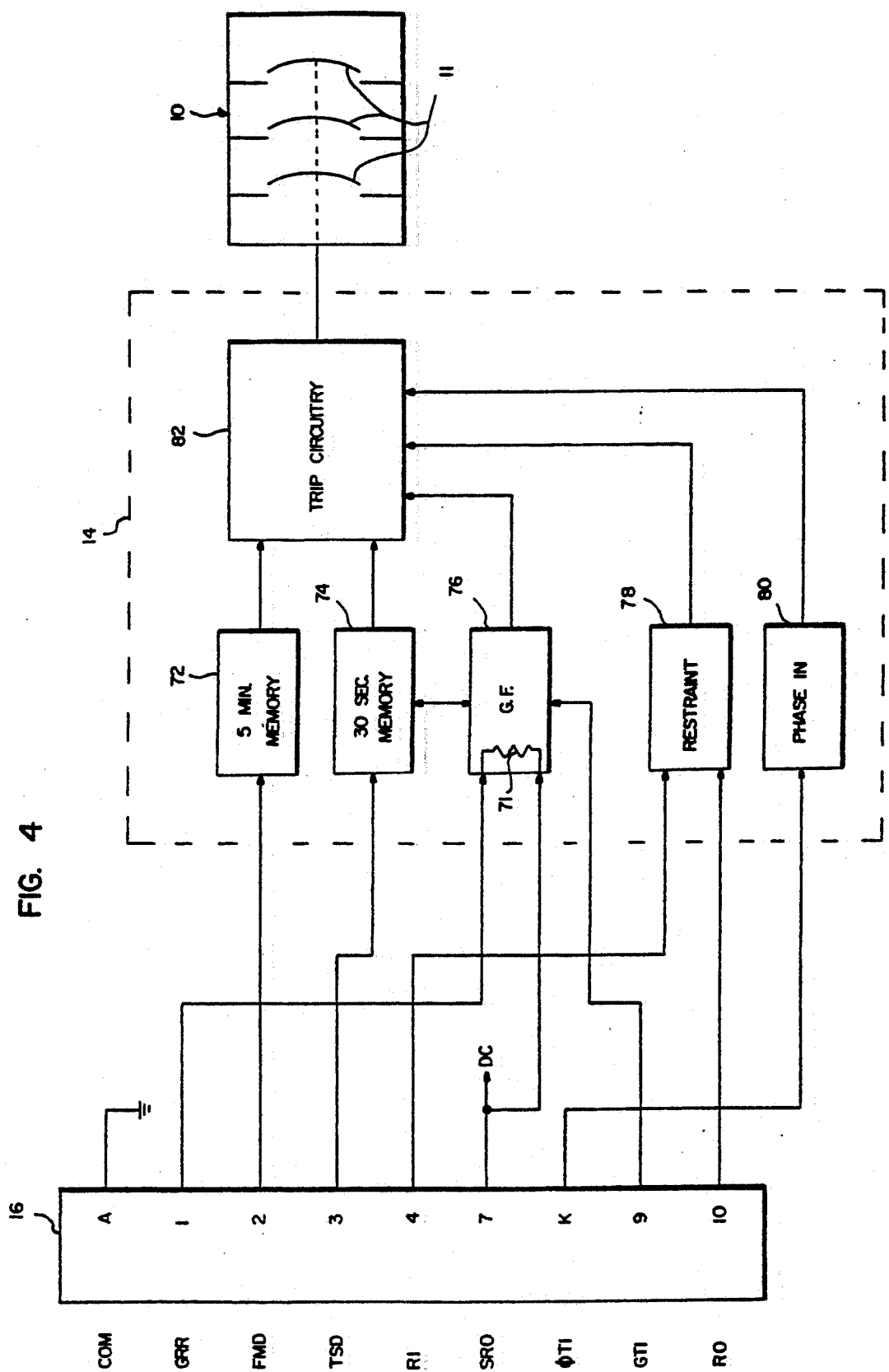

FIG. 4 shows in block form the functions and apparatus of trip unit 14 that are affected by the field tester 18. Trip unit 14 is indicated by the dashed line block and includes a five minute memory 72, a 30 second memory 74, a ground fault circuit (GF) 76 interconnected with 30 second memory 74, a Restraint circuit 78 and a Phase In circuit 80, al 1 coupled to a Trip Circuitry block 82 that is functionally coupled to breaker 10 which has poles 11. It will be appreciated that the trip unit and breaker are well known in the art, as indicated above by the model designations, and that their depiction here is for functional purposes only. The identifications on the terminals of connector socket 16 correspond to those used on the actual breaker, however.

Terminal A of connector socket 16 is connected to ground, terminals 1 (GRR) and 7 (SRO) are connected to the burden resistor 71 in GF 76, terminals 2 (FMD)

and 3 (TSD) are coupled to Memories 72 and 74, respectively, terminals 4 (RI) and 10 (RO) are connected to Restraint 78, terminal K (ØTI) is connected to the Phase In circuit 80 and terminal 9 (GTI) is connected to GF 76.

In operation, amplifier 66 is a low power dual device functioning as a comparator and is designated by device number LM2904. The negative input of amplifier 66 is fixed at Vreg which is 9.35±3.9% volts. Batteries 50 and 52 are 9.0 volts each. +V is 18.0 volts and is divided by resistors 68, 62 and 64 to apply 12.0 volts to the positive input of operational amplifier 66. Under normal conditions, the output of amplifier 66 is high and LED 32, which is a high efficiency, red light emitting diode, is reverse biased and therefore not illuminated. The TEST ON LED 30 is illuminated whenever +V is present. Should the supply voltage drop to a point that the voltage at the positive input of amplifier 66 falls below voltage Vreg, operational amplifier 66 develops a low output and forces LED 32 to conduct through resistor 68, thus illuminating LED 32. LED 32 is now forward biased by approximately 1 volt and the voltage developed thereacross is applied, via resistors 62 and 64, to the positive input of operational amplifier 66. This applied voltage maintains LED 32 in its low output state until power is removed from the tester. Thus the positive feedback to the operational amplifier establishes a bistable or memory function to indicate that the battery voltage was low at some time. An increase in the supply voltage, after LED has been illuminated, does not result in the operational amplifier 66 being switched because conduction of LED 32 keeps the voltage at the positive amplifier input relatively low. The function of capacitor 60 is to maintain the positive input terminal of operational amplifier 66 high for approximately 40 milliseconds when power is initially applied to preclude any erratic startup condition of operational amplifier 66 from producing a battery fail indication.

As mentioned, the reference test voltages V1 and V2 are developed by the voltage divider resistor packs R2 and R3 from the Vreg output with V1 being 3.12±4.0% volts and V2 being 2.08±4.1% volts, respectively. The V1 phase input reference test voltage is the correct voltage reference level for simulating a phase overload condition for the breaker. Similarly, the V2 reference test voltage is the correct one for simulating a ground fault condition for the breaker. Switches S3A? S3B and S3C select between phase and ground fault testing, with switch S3A connecting the correct one of reference voltages V1 and V2 to the positive input of amplifier 88, which is wired as a buffer-follower. Switch S2, when set to PRI INJ, prevents any reference test voltages from being applied to the circuit breaker under test and when switch S3B is set to a phase test, it disables the ground fault function of the circuit breaker.

What has been described is a novel portable tester for testing electronically tripped circuit breakers of particular types. It is recognized that numerous changes in the described embodiment of the invention will be apparent to those skilled in the art without departing from its true spirit and scope. The invention is to be limited only as defined in the claims.

What is claimed is:

1. A portable tester for testing a circuit breaker having a trip unit including a ground fault trip circuit, comprising:

a source of DC power;
voltage regulating means coupled to said source of DC power for supplying a regulated voltage to said trip unit;
voltage divider means coupled to said voltage regulating means for developing a reference voltage for simulating a phase current fault condition;
a first switch for disabling said ground fault trip circuit of said trip unit when simulating said phase current fault condition and a second switch, ganged together with said first switch, for coupling said reference voltage to said trip unit,
an LED for indicating when the voltage from said DC source falls to a predetermined level with respect to the output of said voltage regulator;
a voltage divider connected across said DC source;
a comparator having one input connected to said voltage regulator output and another input connected to said voltage divider; and
said LED being connected between the output of said comparator and said voltage divider.

2. The tester of claim 1, further including memory means in said trip unit for determining overload durations, and
resistive means for rapidly discharging said memory means.

3. The tester of claim 2, further including restraint terminals on said trip unit; and
means for shorting said restraint terminals during testing.

4. The tester of claim 1, further including:
a capacitor coupled across a portion of said voltage divider for delaying operation of said comparator for a predetermined time after application of said DC power.

5. The tester of claim 1, further including a third switch in series with said second switch for delaying application of said reference voltage to said trip unit.

6. The tester of claim 5, further including ground fault memory means in said trip unit; and
resistive means for discharging said ground fault memory means to enable multiple tests.

7. A handheld field tester for testing an electronic trip unit in a circuit breaker having a connector for receiving a replaceable rating plug for changing the current tripping levels of said breaker, said connector having terminals accessing ground fault, phase fault memory and restraint circuits of the trip unit, comprising:
a housing including a similar connector for receiving said rating plug from said breaker;
cable means coupling said connectors in parallel;
a source of DC power;
a voltage regulator coupled to said source of DC power;
means coupled to said voltage regulator for supplying regulated DC power to said trip unit;
means coupled to said voltage regulator for developing reference test voltages; and
mechanical switch means for selectively supplying a reference test voltage to said trip unit for conducting phase and ground fault tests and for disabling said ground fault circuit during a phase fault test,
said trip unit including a phase test memory, a ground fault test memory, and resistive means for rapidly discharging said test memories;
said trip unit also including restraint terminals and means for shorting out said restraint terminals; and said tester further including an LED for indicating when the voltage from said DC source falls to a predetermined level with respect to the output of said voltage regulator, a voltage divider connected across said DC source, a comparator having one input connected to said voltage regulator output and another input connected to said voltage divider, and said LED being connected between the output of said comparator and said voltage divider.

8. The tester of claim 7 wherein said trip unit includes a phase test memory and a ground fault test memory and further including resistive means for rapidly discharging said phase test memory and said ground fault test memory.

9. The tester of claim 8 wherein said trip unit includes restraint terminals and further including means for shorting out said restraint terminals.

10. The tester of claim 9, further including:
a capacitor coupled across a portion of said voltage divider for delaying operation of said comparator for a predetermined time after application of said DC power.

* * * * *